United States Patent
Ebara et al.

(10) Patent No.: US 12,031,682 B2
(45) Date of Patent: Jul. 9, 2024

(54) CRYOGENIC COOLING SYSTEM

(71) Applicant: SUMITOMO HEAVY INDUSTRIES, LTD., Tokyo (JP)

(72) Inventors: Yuta Ebara, Kanagawa (JP); Takaaki Morie, Kanagawa (JP); Jyun Yoshida, Kanagawa (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 1021 days.

(21) Appl. No.: 16/937,245

(22) Filed: Jul. 23, 2020

(65) Prior Publication Data
US 2020/0355326 A1 Nov. 12, 2020

Related U.S. Application Data

(63) Continuation of application No. PCT/JP2018/041615, filed on Nov. 9, 2018.

(30) Foreign Application Priority Data

Jan. 23, 2018 (JP) ................................ 2018-008543

(51) Int. Cl.
*F17C 3/08* (2006.01)
*F17C 3/10* (2006.01)

(52) U.S. Cl.
CPC .................. *F17C 3/08* (2013.01); *F17C 3/10* (2013.01); *F17C 2221/017* (2013.01); *F17C 2223/0161* (2013.01); *F17C 2250/0443* (2013.01)

(58) Field of Classification Search
CPC ...... F17C 3/08; F17C 3/10; F17C 2250/0443; F25B 2309/1428
See application file for complete search history.

(56) References Cited

U.S. PATENT DOCUMENTS

| | | |
|---|---|---|
| 6,679,066 B1 | 1/2004 | Funayama et al. |
| 2006/0184010 A1 | 8/2006 | Fukuda et al. |
| | (Continued) | |

FOREIGN PATENT DOCUMENTS

| | | | |
|---|---|---|---|
| JP | S64-014559 A | | 1/1989 |
| JP | 06074584 A | * | 3/1994 |
| | (Continued) | | |

OTHER PUBLICATIONS

Machine translation of JP 06074584 (Year: 1994).*
(Continued)

*Primary Examiner* — Joseph F Trpisovsky
(74) *Attorney, Agent, or Firm* — Michael Best & Friedrich LLP

(57) ABSTRACT

A cryogenic cooling system includes a gas circulation source; a cryocooler including a cryocooler stage that cools the cooling gas; an object-to-be-cooled gas flow path; a gas supply line that supplies a cooling gas from the gas circulation source via the cryocooler stage to the object-to-be-cooled gas flow path; a gas recovery line that recovers the cooling gas from the object-to-be-cooled gas flow path to the gas circulation source; at least one temperature sensor installed at a measurement location away from the object-to-be-cooled gas flow path along the gas supply line and/or a measurement location installed away from the object-to-be-cooled gas flow path along the gas recovery line; and a gas flow rate control unit that controls the gas circulation source to adjust a flow rate of the cooling gas flowing through the object-to-be-cooled gas flow path in accordance with a measured temperature at at least one measurement location.

8 Claims, 7 Drawing Sheets

(56) References Cited

U.S. PATENT DOCUMENTS

| | | | |
|---|---|---|---|
| 2013/0067952 A1 | 3/2013 | Ri et al. | |
| 2014/0260339 A1* | 9/2014 | Matsui | F04B 37/085 62/55.5 |
| 2017/0038123 A1 | 2/2017 | Strickland et al. | |
| 2018/0259219 A1 | 9/2018 | Motomura | |
| 2019/0011169 A1 | 1/2019 | Oikawa | |

FOREIGN PATENT DOCUMENTS

| | | |
|---|---|---|
| JP | H08-078737 A | 3/1996 |
| JP | 2006-201018 A | 8/2006 |
| WO | WO-2015/114839 A1 | 8/2015 |
| WO | WO-2017/072831 A1 | 5/2017 |
| WO | 2017159580 A1 | 9/2017 |

OTHER PUBLICATIONS

Machine translation of JP 2006201018 (Year: 2006).*
Search Report issued in European Application No. 18902341.9, dated Feb. 8, 2021.

* cited by examiner

CRYOGENIC COOLING SYSTEM

RELATED APPLICATIONS

The contents of Japanese Patent Application No. 2018-008543, and of International Patent Application No. PCT/JP2018/041615, on the basis of each of which priority benefits are claimed in an accompanying application data sheet, are in their entirety incorporated herein by reference.

BACKGROUND

Technical Field

A certain embodiment of the present invention relates to a cryogenic cooling system.

Description of Related Art

Circulation cooling systems that cool an object to be cooled such as a superconducting electromagnet with a gas cooled to a cryogenic temperature have been known from the past. A cryocooler such as a Gifford-McMahon (GM) refrigerator is often used for cooling the cooling gas.

SUMMARY

According to an embodiment of the present invention, there is provided a cryogenic cooling system including a gas circulation source that circulates a cooling gas; a cryocooler including a cryocooler stage that cools the cooling gas; an object-to-be-cooled gas flow path provided around or inside an object to be cooled for causing the cooling gas to flow therethrough; a gas supply line that connects the gas circulation source to an inlet of the object-to-be-cooled gas flow path to supply the cooling gas from the gas circulation source via the cryocooler stage to the object-to-be-cooled gas flow path; a gas recovery line that connects an outlet of the object-to-be-cooled gas flow path to the gas circulation source so as to recover the cooling gas from the object-to-be-cooled gas flow path to the gas circulation source; at least one temperature sensor that is installed at a measurement location away from the inlet of the object-to-be-cooled gas flow path along the gas supply line and/or a measurement location installed away from the outlet of the object-to-be-cooled gas flow path along the gas recovery line; and a gas flow rate control unit that controls the gas circulation source so as to adjust a flow rate of the cooling gas flowing through the object-to-be-cooled gas flow path in accordance with a measured temperature at at least one measurement location by the temperature sensor.

In addition, any combinations of the above-described components, and mutual substitutions of the components and expressions of the present invention between methods, apparatuses, systems, and the like are also effective as aspects of the present invention.

DETAILED DESCRIPTION

Figure 1:
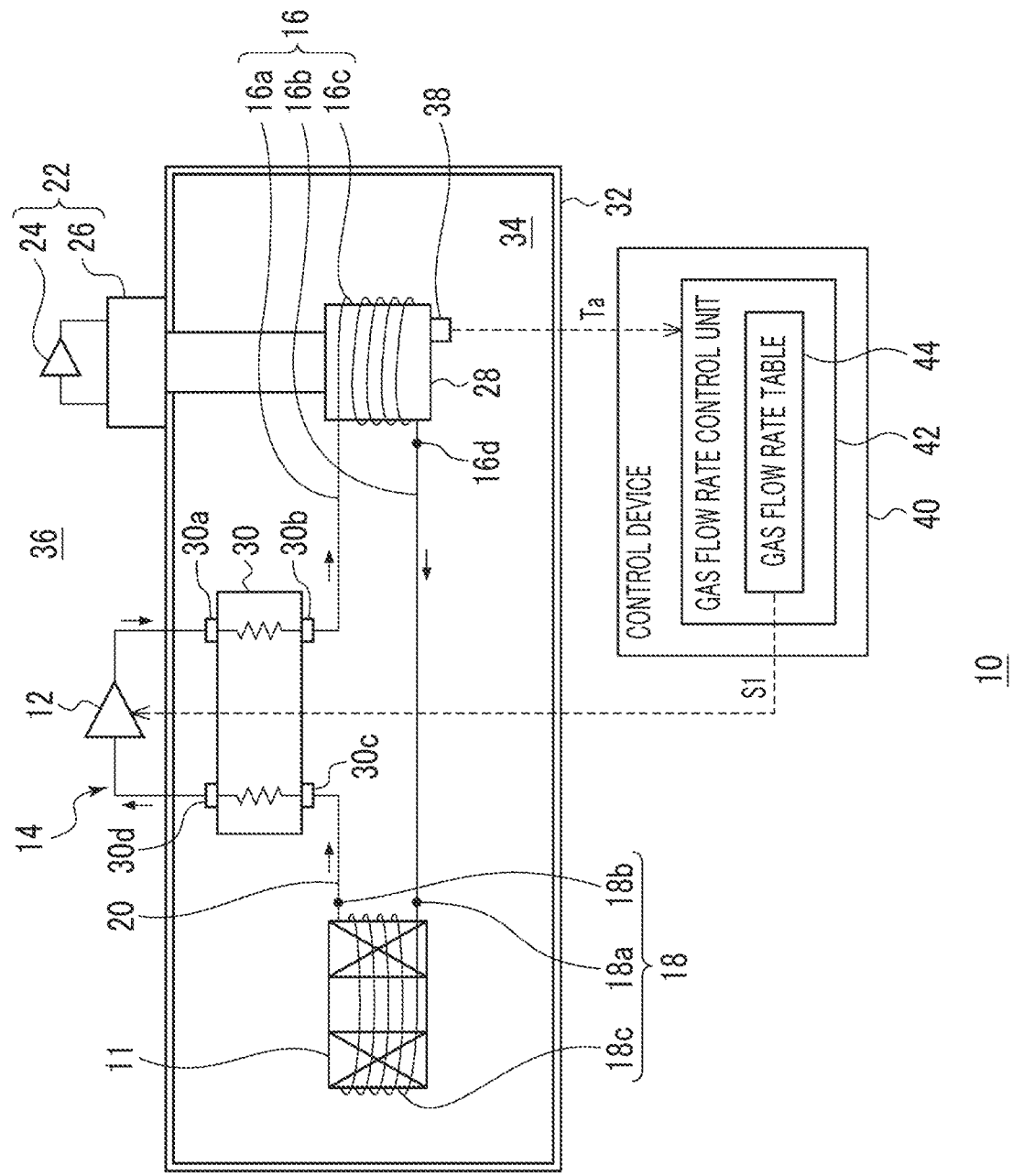
FIG. 1 is a view schematically illustrating a cryogenic cooling system according to an embodiment.

The cryogenic cooling systems should maintain the object to be cooled at a desired cooling target temperature. However, the heat load of the system may fluctuate due to the operating state of the object to be cooled and other factors, and the temperature of the object to be cooled may fluctuate accordingly. Thus, it is desired to measure the temperature of the object to be cooled in order to monitor or control the temperature of the object to be cooled, and a temperature sensor is installed in the object to be cooled. In that case, the temperature sensor may be used in a harsh environment.

The temperature sensor is disposed at a cryogenic temperature where the object to be cooled is cooled. Of course, the temperature sensor should be one that can be used at the cryogenic temperature. Besides, the object to be cooled is often disposed in a strong magnetic field environment. In a case where the object to be cooled is a superconducting electromagnet, the object to be cooled itself becomes a strong magnetic field generation source. The temperature sensor is also exposed to the strong magnetic field together with the object to be cooled. The temperature sensor may be adversely affected by a strong magnetic field such as unstable operation or failure. Therefore, the strong magnetic field environment may bring about a decrease in the accuracy of the temperature measurement of the object to be cooled and thus the temperature control.

There is also a case where a cryogenic cooling system is attached to a particle accelerator. The object to be cooled may be a main component (for example, a superconducting electromagnet) of the accelerator that produces an accelerating force that acts on a particle, and may be disposed at or in the vicinity of a beamline of the accelerated particle. Incidence and collision of the accelerated particle on the surface of the object to be cooled can activate the object to be cooled. Therefore, the temperature sensor to be installed in the object to be cooled may also be required to have radiation resistance.

In a case where the temperature sensor malfunctions or fails, maintenance such as repair or replacement of the temperature sensor is performed. Since the cooling operation of the cryogenic cooling system is stopped during the maintenance work, such work causes downtime not only for the cryogenic cooling system but also for the object to be cooled. Therefore, in order to reduce the frequency of maintenance, a temperature sensor that is resistant to the harsh environment and operates normally as exemplified above is desired. However, a temperature sensor having excellent durability is generally expensive.

In some cases, the cryocooler for cooling the gas is disposed at a great distance from the object to be cooled. If the temperature sensor is installed in the object to be cooled, the cryocooler and the temperature sensor are at locations physically separated from each other. Thus, it is difficult to perform each maintenance work together. Workability is reduced.

In addition, necessary power sources, wiring, and other auxiliary devices may be disposed around the object to be cooled. For that reason, the locations where the temperature sensor and its wiring can be installed are limited. The degree of freedom of the installation location is low.

In this way various disadvantages may occur due to installation of the temperature sensor to be used for the cryogenic cooling system onto the object to be cooled. In addition, the cryogenic cooling system is also required to efficiently cool the object to be cooled.

It is desirable to provide a cryogenic cooling system suitable for practical use that addresses at least one of the above description.

Hereinafter, embodiments for carrying out the present invention will be described in detail with reference to the drawings. In the description and drawings, the same or equivalent components, members, and processing are designated by the same reference signs, and redundant description will be appropriately omitted. The scales and shapes of the respective parts illustrated in the figures are set for the sake of convenience for facilitating description, and should not be interpreted as limiting unless otherwise specified. The embodiments are examples and do not limit the scope of the present invention. All the features and combinations described in the embodiments are not necessarily essential to the invention.

FIG. 1 is a view schematically illustrating a cryogenic cooling system 10 according to an embodiment. The cryogenic cooling system 10 is a circulation cooling system configured to cool an object 11 to be cooled to a target temperature by circulating a cooling gas. As the cooling gas, for example, helium gas is often used, but another gas suitable for the cooling temperature may be utilized.

The object 11 to be cooled is, for example, a superconducting electromagnet. The superconducting electromagnet is mounted on, for example, a particle accelerator used for a particle beam therapy apparatus or other apparatus, or another superconducting apparatus. In addition, needless to say, the object 11 to be cooled is not limited to the superconducting electromagnet. The object 11 to be cooled may be other equipment or fluid for which cryogenic cooling is desired.

The target cooling temperature is a desired cryogenic temperature selected from a temperature range from a predetermined lower limit temperature to a predetermined upper limit temperature. The lower limit temperature is, for example, a lowest temperature at which cooling can be made by the cryogenic cooling system 10, and may be, for example, 4 K. The upper limit temperature is, for example, a desired cryogenic temperature selected from a temperature range equal to or lower than a superconducting critical temperature. The superconducting critical temperature is determined in accordance with a superconducting material to be used, but is, for example, a liquid nitrogen temperature or lower, or a cryogenic temperature of 30 K or lower, 20 K or lower, or 10 K or lower. Therefore, the target cooling temperature is selected from, for example, a temperature range of 4 K to 30 K or a temperature range of 10 K to 20 K.

The cryogenic cooling system 10 includes a gas circulation source 12 that circulates a cooling gas, and a cooling gas flow path 14 through which the cooling gas flows to cool the object 11 to be cooled. The gas circulation source 12 is configured to control the supplied cooling gas flow rate according to a gas circulation source control signal S1. The gas circulation source 12 includes, for example, a compressor that pressure-increases and delivers the recovered cooling gas. The cooling gas flow path 14 includes a gas supply line 16, an object-to-be-cooled gas flow path 18, and a gas recovery line 20. The gas circulation source 12 and the cooling gas flow path 14 constitute a cooling gas circulation circuit. Several arrows drawn along the cooling gas flow path 14 in FIG. 1 indicate the flow direction of the cooling gas.

The gas circulation source 12 is connected to the gas recovery line 20 so as to recover the cooling gas from the gas recovery line 20, and is also connected to the gas supply line 16 so as to supply the pressure-increased cooling gas to the gas supply line 16. In addition, the gas supply line 16 is connected to the object-to-be-cooled gas flow path 18 so as to supply the cooling gas to the object-to-be-cooled gas flow path 18, and the gas recovery line 20 is connected to the object-to-be-cooled gas flow path 18 so as to recover the cooling gas from the object-to-be-cooled gas flow path 18.

The gas supply line 16, the object-to-be-cooled gas flow path 18, and/or the gas recovery line 20 may be flexible pipes or rigid pipes.

The cryogenic cooling system 10 includes a cryocooler 22 that cools the cooling gas of the cryogenic cooling system 10. The cryocooler 22 includes a compressor 24, and a cold head 26 including a cryocooler stage 28.

The compressor 24 of the cryocooler 22 is configured to recover the working gas of the cryocooler 22 from the cold head 26, pressure-increases the collected working gas, and supply the working gas to the cold head 26 again. The compressor 24 and the cold head 26 constitute a circulation circuit for the working gas, that is, a refrigeration cycle of the cryocooler 22, and the cryocooler stage 28 is cooled by the refrigeration cycle. The working gas is typically helium gas, but any other suitable gas may be used. The cryocooler 22 is, for example, a Gifford-McMahon (GM) cryocooler, but may be a pulse tube cryocooler, a Stirling cryocooler, or another cryocooler.

The compressor 24 of the cryocooler 22 is provided separately from the gas circulation source 12. The working gas circulation circuit of the cryocooler 22 is fluidly isolated from the cooling gas circulation circuit of the cryogenic cooling system 10.

The object-to-be-cooled gas flow path 18 is provided around or inside the object 11 to be cooled for flowing the cooling gas. The object-to-be-cooled gas flow path 18 includes an inlet 18a, an outlet 18b, and a gas pipe 18c extending from the inlet 18a to the outlet 18b. The gas supply line 16 is connected to the inlet 18a of the object-to-be-cooled gas flow path 18, and the gas recovery line 20 is connected to the outlet 18b of the object-to-be-cooled gas flow path 18. Therefore, the cooling gas flows into the gas pipe 18c from the gas supply line 16 through the inlet 18a, and further flows out from the gas pipe 18c through the outlet 18b to the gas recovery line 20.

The gas pipe 18c is in physical contact with the object 11 to be cooled and thermally coupled to the object 11 to be cooled such that the object 11 to be cooled is cooled by heat exchange between the cooling gas flowing in the gas pipe 18c and the object 11 to be cooled. As an example, the gas pipe 18c is a coil-shaped cooling gas pipe disposed in contact with an outer surface of the object 11 to be cooled so as to surround the periphery of the object 11 to be cooled.

In a case where the object-to-be-cooled gas flow path 18 is configured as a piping member separate from the gas supply line 16, the inlet 18a may be a pipe coupling provided at one end of the gas pipe 18c for connecting the gas supply line 16 to the object-to-be-cooled gas flow path 18. In a case where the object-to-be-cooled gas flow path 18 is configured as an integrated piping member that is continuous from the gas supply line 16, the inlet 18a refers to a location where the gas pipe 18c starts physical contact with the object 11 to be cooled, or this contact start point may be regarded as the inlet 18a of the object-to-be-cooled gas flow path 18. In addition, in a case where the object-to-be-cooled gas flow path 18 passes through the inside of the object 11 to be cooled, the inlet 18a may literally refer to a part where the object-to-be-cooled gas flow path 18 enters the object 11 to be cooled.

Similarly, in a case where the object-to-be-cooled gas flow path 18 is configured as a piping member separate from the gas recovery line 20, the outlet 18b may be a pipe coupling provided at the other end of the gas pipe 18c in order to connect the gas recovery line 20 to the object-to-be-cooled gas flow path 18. In a case where the object-to-be-cooled gas flow path 18 is configured as an integrated piping member continuous from the gas recovery line 20, the outlet 18b may refer to a location where the gas pipe 18c ends the physical contact with the object 11 to be cooled, or this contact end point may be regarded as the outlet 18b of the object-to-be-cooled gas flow path 18. In addition, in a case where the object-to-be-cooled gas flow path 18 passes through the inside of the object 11 to be cooled, the outlet 18b may literally refer to a part where the object-to-be-cooled gas flow path 18 exits from the object 11 to be cooled.

In other words, neither the gas supply line 16 nor the gas recovery line 20 is in physical contact with the object 11 to be cooled. The gas supply line 16 extends in a direction away from the object 11 to be cooled from the inlet 18a of the object-to-be-cooled gas flow path 18, and the gas recovery line 20 extends in the direction away from in the object 11 to be cooled from the outlet 18b of the object-to-be-cooled gas flow path 18. The cryocooler 22 and the cryocooler stage 28 thereof are also disposed apart from the object 11 to be cooled.

The gas supply line 16 connects the gas circulation source 12 to the inlet 18a of the object-to-be-cooled gas flow path 18 so as to supply the cooling gas from the gas circulation source 12 via the cryocooler stage 28 to the object-to-be-cooled gas flow path 18. The gas supply line 16 physically contacts the cryocooler stage 28 and is thermally coupled to the cryocooler stage 28 such that the cooling gas is cooled by heat exchange between the cooling gas flowing through the gas supply line 16 and the cryocooler stage 28. Therefore, the cooling gas flows into the gas supply line 16 from the gas circulation source 12, is cooled by the cryocooler stage 28, and flows out from the gas supply line 16 to the object-to-be-cooled gas flow path 18.

Hereinafter, for convenience of description, a portion of the gas supply line 16 from the gas circulation source 12 to the cryocooler stage 28 may be referred to as an upstream part 16a of the gas supply line 16, and a portion of the gas supply line 16 from the cryocooler stage 28 to the inlet 18a of the object-to-be-cooled gas flow path 18 may be referred to as a downstream part 16b of the gas supply line 16. That is, the gas supply line 16 includes the upstream part 16a and the downstream part 16b.

In addition, a portion of the gas supply line 16 disposed in the cryocooler stage 28 can be referred to as an intermediate part 16c of the gas supply line 16. As an example, the intermediate part 16c of the gas supply line 16 is a coil-shaped cooling gas pipe disposed in contact with the outer surface of the cryocooler stage 28 so as to surround the periphery of the cryocooler stage 28.

Therefore, the cooling gas has the lowest attainment temperature in the cooling gas flow path 14 at the outlet 16d of the intermediate part 16c of the gas supply line 16 (that is, the inlet of the downstream part 16b).

The gas recovery line 20 connects the outlet 18b of the object-to-be-cooled gas flow path 18 to the gas circulation source 12 so as to recover the cooling gas from the object-to-be-cooled gas flow path 18 to the gas circulation source 12. Therefore, the cooling gas flows into the gas recovery line 20 from the object-to-be-cooled gas flow path 18 and flows out from the gas recovery line 20 to the gas circulation source 12.

In addition, the cryogenic cooling system 10 also includes a heat exchanger 30. The heat exchanger 30 is configured such that the cooling gases flowing through the gas supply line 16 and the gas recovery line 20 exchange heat with each other between the gas supply line 16 and the gas recovery line 20. The heat exchanger 30 helps improve the cooling efficiency of the cryogenic cooling system 10.

The heat exchanger 30 includes a high-temperature inlet 30a and a low-temperature outlet 30b on the gas supply line 16 (more specifically, the upstream part 16a), and a low-temperature inlet 30c and a high-temperature outlet 30d on the gas recovery line 20. A supply-side cooling gas, that is, a high-temperature cooling gas that flows into the heat exchanger 30 from the gas circulation source 12 through the high-temperature inlet 30a is cooled by the gas recovery line 20 in the heat exchanger 30, and flows to the cryocooler stage 28 through the low-temperature outlet 30b. Along with this, a recovery-side cooling gas, that is, a low-temperature cooling gas flowing into the heat exchanger 30 through the low-temperature inlet 30c from the object-to-be-cooled gas flow path 18 is heated by the gas supply line 16 in the heat exchanger 30, and flows to the gas circulation source 12 through the high-temperature outlet 30d.

The cryogenic cooling system 10 includes a vacuum chamber 32 that defines a vacuum environment 34. The vacuum chamber 32 is configured to isolate the vacuum environment 34 from a surrounding environment 36. The vacuum chamber 32 is, for example, a cryogenic vacuum chamber such as a cryostat. The vacuum environment 34 is, for example, a cryogenic vacuum environment, and the surrounding environment 36 is, for example, a room temperature and atmospheric pressure environment.

The object 11 to be cooled is disposed in the vacuum chamber 32, that is, in the vacuum environment 34. Among the main components of the cryogenic cooling system 10, the object-to-be-cooled gas flow path 18, the cryocooler stage 28 of the cryocooler 22, and the heat exchanger 30 are disposed in the vacuum environment 34. Meanwhile, the gas circulation source 12 and the compressor 24 of the cryocooler 22 are disposed outside the vacuum chamber 32, that is, in the surrounding environment 36. Therefore, one end of the gas supply line 16 and the gas recovery line 20 connected to the gas circulation source 12 is disposed in the surrounding environment 36, and the remaining portion is disposed in the vacuum environment 34.

The cryogenic cooling system 10 includes at least one temperature sensor 38 and a control device 40 that controls the cryogenic cooling system 10. The control device 40 includes a gas flow rate control unit 42. The gas flow rate control unit 42 includes a gas flow rate table 44. The control device 40 is disposed in the surrounding environment 36.

Although the control device 40 of the cryogenic cooling system 10 is realized by elements and circuits including a CPU and memories of a computer as a hardware configuration and realized by a computer program or the like as a software configuration, the control device 40 is appropriately drawn in FIG. 1 as functional blocks realized by the cooperation. Those skilled in the art will understand that these functional blocks can be realized in various ways by combining hardware and software.

The temperature sensor 38 is installed in the cryocooler stage 28. In this way, only one temperature sensor 38 is provided in the cooling gas flow path 14 of the cryogenic cooling system 10, specifically, in the gas supply line 16. Therefore, the temperature sensor 38 is provided neither in the object-to-be-cooled gas flow path 18 nor in the object 11 to be cooled. The temperature sensor 38 is also not provided in the gas recovery line 20.

In addition, the installation location of the temperature sensor 38 is not limited to the cryocooler stage 28. Although several examples will be described below, the temperature sensor 38 may in principle be installed at any location in the cooling gas flow path 14 including the object-to-be-cooled gas flow path 18. In addition, a plurality of the temperature sensors 38 may be installed at different locations in the cooling gas flow path 14.

The temperature sensor 38 is configured to generate a measured temperature signal Ta representing a measured temperature at a measurement location and output the measured temperature signal Ta to the control device 40. Since the temperature sensor 38 is installed in the cryocooler stage 28, the measured temperature signal Ta represents the cooling temperature of the cryocooler stage 28. The measured temperature signal Ta can also be regarded as representing the lowest attainment temperature of the cooling gas that can be cooled by the cryogenic cooling system 10, for example, the cooling gas temperature at the outlet 16d of the intermediate part 16c of the gas supply line 16.

The gas flow rate control unit 42 is configured to control the gas circulation source 12 so as to adjust the flow rate of the cooling gas flowing through the object-to-be-cooled gas flow path 18 in accordance with the measured temperature measured by the temperature sensor 38 at at least one measurement location. The gas flow rate control unit 42 determines a target cooling gas flow rate according to the gas flow rate table 44 in accordance with the measured temperature at a specific measurement location, and controls the gas circulation source 12 so as to cause the cooling gas to flow through the object-to-be-cooled gas flow path 18 with the target cooling gas flow rate.

The gas flow rate table 44 is configured to associate the target cooling gas flow rate with each of a plurality of different cooling temperatures at the specific measurement location. That is, the gas flow rate table 44 defines the target cooling gas flow rate corresponding to each of the plurality of different cooling temperatures. The gas flow rate table 44 may have a function, a look-up table, a map, or another format representing a correspondence relationship between the cooling temperature and the cooling gas flow rate. The gas flow rate table 44 is created in advance (for example, by the manufacturer of the cryogenic cooling system 10) and is stored in the control device 40 or a storage device accompanied thereby.

The target cooling gas flow rate is set, for example, such that the cryogenic cooling system 10 provides sufficient cooling capacity to cool the object 11 to be cooled to a target temperature. The target cooling gas flow rate can be appropriately set for each cooling temperature on the basis of a designer's empirical knowledge or designer's experiments and simulations.

Preferably, the gas flow rate table 44 is configured to associate an optimal cooling gas flow rate for maximizing the cooling capacity of the cryogenic cooling system 10 for each of the plurality of different cooling temperatures at the specific measurement location. In the gas flow rate table 44, the optimal cooling gas flow rate for maximizing the cooling capacity of the cryogenic cooling system 10 is set as the target cooling gas flow rate for each cooling temperature.

Figure 2:
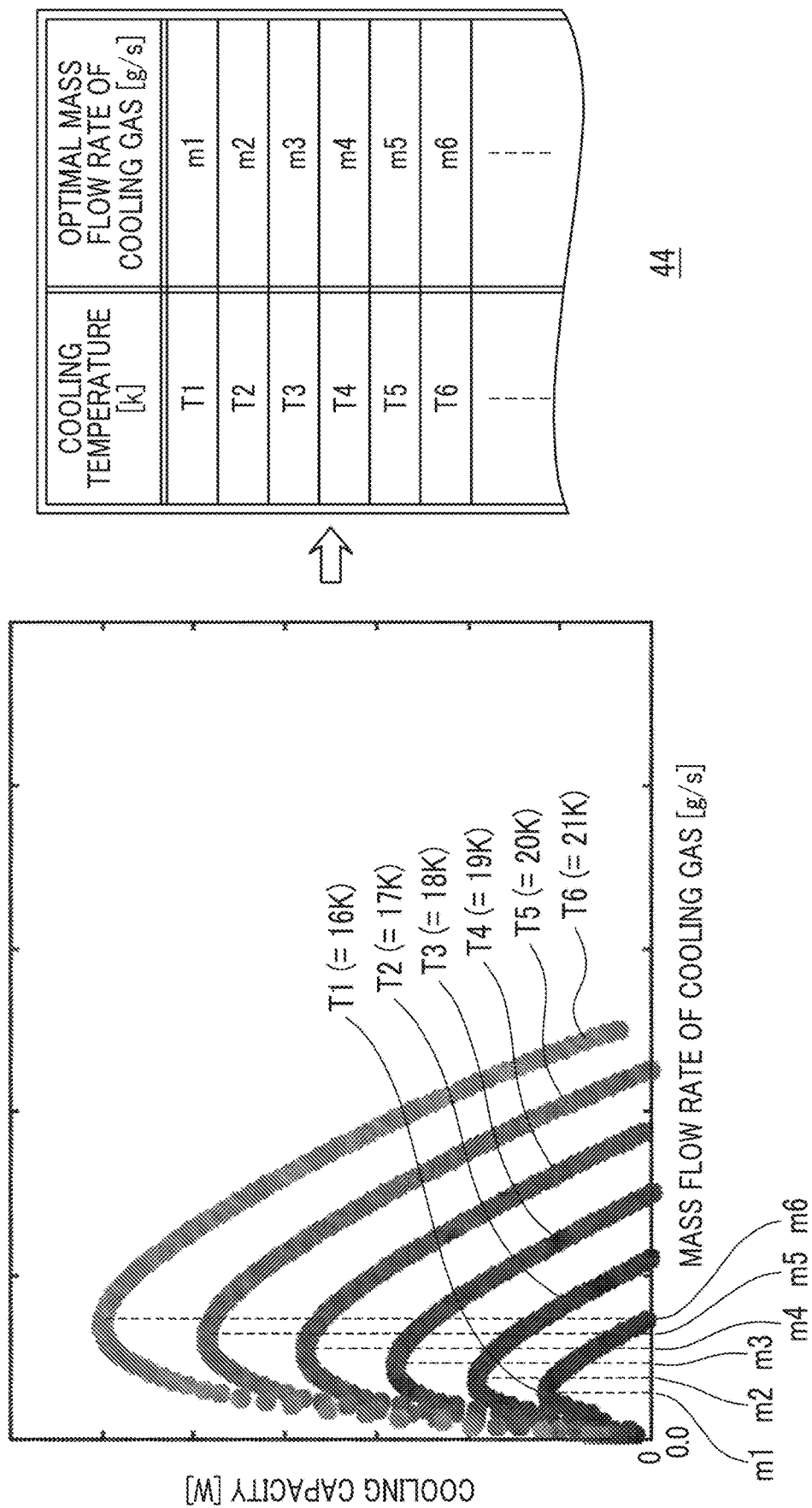
FIG. 2 is a view illustrating a gas flow rate table according to the embodiment.

FIG. 2 is a view illustrating the gas flow rate table 44 according to the embodiment. As illustrated on the right side of FIG. 2, in the gas flow rate table 44, target cooling gas flow rates, for example, optimal mass flow rates (for example, m1 to m6) of the cooling gas are respectively associated with a plurality of cooling temperatures (for example, T1 to T6). The gas flow rate table 44 has a plurality of cooling temperature values and target cooling gas flow rate values corresponding to the cooling temperature values, respectively. The gas flow rate table 44 may have an interpolation function for deriving a target cooling gas flow rate value corresponding to a cooling temperature value between one cooling temperature value and another cooling temperature value.

The plurality of cooling temperatures set in the gas flow rate table 44 represent temperatures at the specific location in the cooling gas flow path 14, for example, temperatures at the installation location of the temperature sensor 38. Therefore, the plurality of cooling temperatures correspond to the temperatures of the cryocooler stage 28 in the embodiment illustrated in FIG. 1. The plurality of cooling temperatures are set at appropriate intervals (for example, equal intervals) in a desired temperature range for cooling the object 11 to be cooled. For example, the plurality of cooling temperatures may be set in steps of 1K in a temperature range of 10 K to 20 K.

The plurality of cooling temperatures set in the gas flow rate table 44 may represent temperatures at locations different from the installation location of the temperature sensor 38. In that case, the gas flow rate table 44 may have a temperature conversion function or a thermodynamic model that calculates the temperatures of the locations different from the temperature of the installation location of the temperature sensor 38.

The optimal mass flow rate of the cooling gas represents the mass flow rate of the cooling gas flowing through the object-to-be-cooled gas flow path 18. In addition, as is known, since the mass flow rate is constant at each location of the cooling gas flow path 14, the optimal mass flow rate of the cooling gas can also be said to be the mass flow rate supplied from the gas circulation source 12.

The optimal mass flow rate is determined from a relationship between the mass flow rate for each cooling temperature and the cooling capacity of the cryogenic cooling system 10. As illustrated on the left side of FIG. 2, a cooling capacity curve with respect to the mass flow rate can be obtained in advance for each cooling temperature. As can be seen from the figure, the cooling capacity curve has a maximum at a specific mass flow rate. Therefore, the mass flow rate that gives the maximum cooling capacity can be used as the optimal mass flow rate. The mass flow rate for maximizing the cooling capacity depends on the cooling temperature. Specifically, the lower the cooling temperature, the smaller the optimal mass flow rate.

In addition, in the cooling capacity curve for one certain cooling temperature, the cooling capacity decreases at a mass flow rate smaller than the optimal mass flow rate because the amount of heat by which the cooling gas can be carried away from the object 11 to be cooled by heat exchange between the cooling gas and the object 11 to be cooled at such a small flow rate can be small at such a small flow rate. In addition, the reason why the cooling capacity decreases at a mass flow rate larger than the optimal mass flow rate is due to the restriction by the cooling capacity of the cryocooler 22. As the cooling gas flow rate increases, the heat exchange between the cooling gas and the cryocooler stage 28 may be insufficient, and the temperature of the cooling gas flowing to the object 11 to be cooled may increase.

Figure 3:
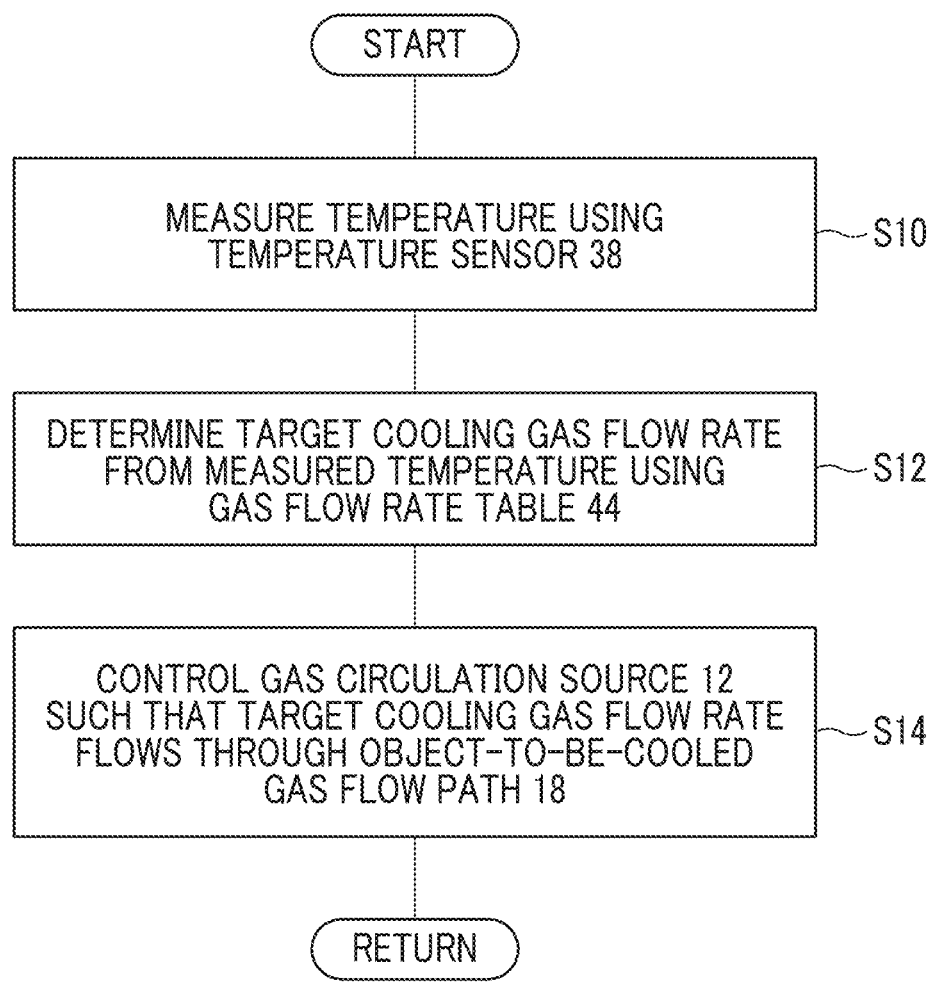
FIG. 3 is a flowchart illustrating a control method of the cryogenic cooling system according to the embodiment.

FIG. 3 is a flowchart illustrating a control method of the cryogenic cooling system 10 according to the embodiment. A control routine illustrated in FIG. 3 is periodically and repeatedly executed by the control device 40 during the operation of the cryogenic cooling system 10.

First, the temperature at the installation location is measured using the temperature sensor 38 (S10). The temperature sensor 38 generates a measured temperature signal Ta representing the measured temperature at the measurement location, and outputs the measured temperature signal Ta to the control device 40. For example, the temperature sensor 38 measures the temperature of the cryocooler stage 28. The temperature sensor 38 outputs the measured temperature signal Ta representing the measured temperature of the cryocooler stage 28 to the gas flow rate control unit 42.

Next, the target cooling gas flow rate is determined from the measured temperature using the gas flow rate table 44 (S12). When the measured temperature signal Ta is input from the temperature sensor 38, the gas flow rate control unit 42 determines the target cooling gas flow rate corresponding to the measured temperature signal Ta according to the gas flow rate table 44. For example, the gas flow rate control unit 42 determines the optimal mass flow rate of the cooling gas corresponding to the measured temperature signal Ta according to the gas flow rate table 44.

The gas flow rate control unit 42 controls the gas circulation source 12 so as to cause the cooling gas to flow through the object-to-be-cooled gas flow path 18 with the determined target cooling gas flow rate (S14). From the determined target cooling gas flow rate, the gas flow rate control unit 42 generates a gas circulation source control signal S1 that realizes this target flow rate. The gas circulation source control signal S1 represents an operating parameter of the gas circulation source 12 that determines the flow rate of the cooling gas supplied to the cooling gas flow path 14 by the gas circulation source 12. The gas circulation source control signal S1 may represent, for example, the rotation speed of a motor that drives the gas circulation source 12. Alternatively, the gas circulation source control signal S1 may be a gas flow rate instruction signal representing the determined target cooling gas flow rate. In this case, the gas circulation source 12 may be configured to control the supplied cooling gas flow rate according to the gas flow rate instruction signal.

In this way, the gas flow rate control unit 42 generates the gas circulation source control signal S1 in accordance with the measured temperature signal Ta and outputs the gas circulation source control signal S1 to the gas circulation source 12. The gas circulation source 12 operates according to the gas circulation source control signal S1, so that the target cooling gas flow rate can be caused to flow through the object-to-be-cooled gas flow path 18. The control device 40 can regularly execute such cooling gas flow rate control processing.

According to the cryogenic cooling system 10 of the embodiment, it is possible to adjust the flow rate of the cooling gas flowing through the object-to-be-cooled gas flow path 18 in accordance with the measured temperature measured by the temperature sensor 38. Since an appropriate cooling gas flow rate can be supplied from the gas circulation source 12 to the object-to-be-cooled gas flow path 18 in accordance with the cooling temperature, the object 11 to be cooled can be efficiently cooled. Particularly, by adjusting the cooling gas flow rate to the optimal mass flow rate, the object 11 to be cooled can be cooled with the maximum cooling capacity according to the cooling temperature.

Since the temperature sensor 38 is installed in the cryocooler stage 28, the temperature sensor 38 can be disposed away from the object 11 to be cooled. For that reason, even if a strong magnetic field is generated in the vicinity of the object 11 to be cooled, the magnetic field weakens at the installation location of the temperature sensor 38. Therefore, the influence of the strong magnetic field on the temperature sensor 38 can be suppressed. For example, the risk of failure of the temperature sensor 38 can be reduced. It is also possible to adopt a relatively inexpensive sensor as the temperature sensor 38. In addition, the temperature sensor 38 and the cryocooler 22 can be maintained together, which improves workability.

In addition, since the cryocooler stage 28 is a cooling source for the object 11 to be cooled, it is considered that the temperature changes of the cryocooler stage 28 have a strong correlation with the amount of heat generated by the object 11 to be cooled. Therefore, measuring the temperature in the cryocooler stage 28 is advantageous in that the information regarding the heat generation amount of the object 11 to be cooled can be acquired more accurately.

Since only one temperature sensor 38 needs to be provided in the cryogenic cooling system 10, the configuration and control processing are simple.

Since the temperature sensor 38 is installed in the cryocooler stage 28, the temperature sensor 38 is also useful in that the measured temperature signal Ta can be utilized for monitoring the cryocooler 22. In addition, as an alternative, the cryocooler 22 can also be monitored by installing temperature sensors upstream and downstream of the cryocooler stage 28 (for example, the upstream part 16a and the downstream part 16b of the gas supply line 16, respectively).

In the embodiment illustrated in FIG. 1, the temperature sensor 38 is installed at a measurement location away from the inlet 18a of the object-to-be-cooled gas flow path 18, specifically, in the cryocooler stage 28 along the gas supply line 16. Only one temperature sensor 38 is provided in the cooling gas flow path 14 of the cryogenic cooling system 10. However, the disposition of the temperature sensor 38 is not limited to this. The temperature sensor 38 can be installed in various locations. Several examples will be described with reference to FIG. 4.

Figure 4:
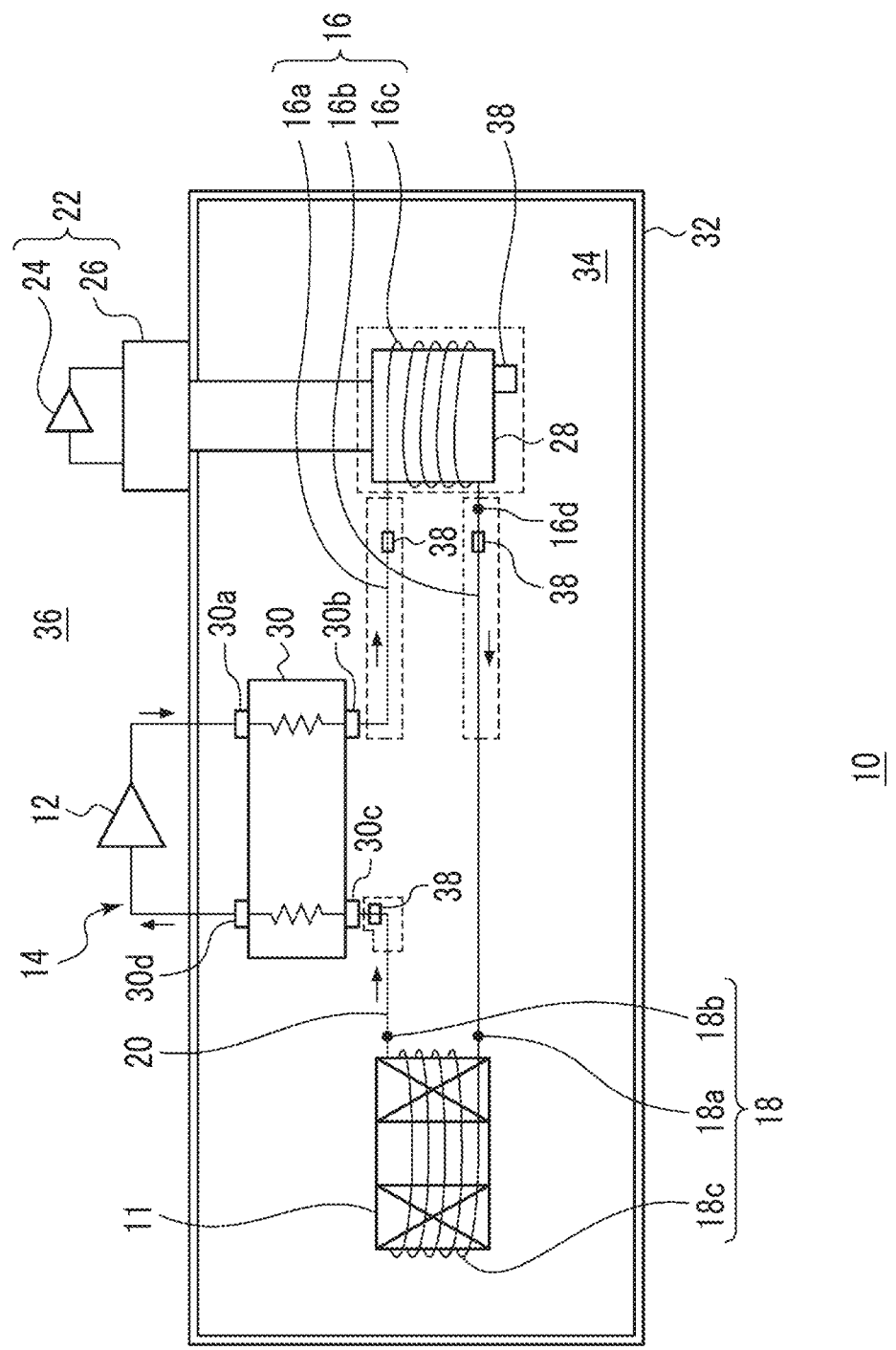
FIG. 4 is a schematic view illustrating the disposition of temperature sensors in the cryogenic cooling system according to the embodiment.

FIG. 4 is a schematic view illustrating the disposition of the temperature sensor 38 in the cryogenic cooling system 10 according to the embodiment. FIG. 4 illustrates the cryogenic cooling system 10 having the same cooling gas flow path configuration as illustrated in FIG. 1. In FIG. 4, an example in which a preferable region for installing the temperature sensor 38 is illustrated by a broken line and the temperature sensor 38 is installed at a typical location in the region is illustrated. A plurality of the temperature sensors 38 are illustrated in FIG. 4. All the temperature sensors 38 illustrated may be installed in the cryogenic cooling system 10, several temperature sensors 38 of the temperature sensors 38 illustrated may be installed, or only any one temperature sensor 38 may be installed.

The temperature sensor 38 is installed at a measurement location away from the inlet 18a of the object-to-be-cooled gas flow path 18 along the gas supply line 16. By doing so, the temperature sensor 38 is disposed away from the object 11 to be cooled. Therefore, it is possible to suppress the influence on the temperature sensor 38 by the strong magnetic field that may be generated in the vicinity of the object 11 to be cooled. Compared to a case where the temperature sensor 38 is installed in the object-to-be-cooled gas flow path 18, the influence of the magnetic field on the temperature sensor 38 is suppressed.

Not only the object-to-be-cooled gas flow path 18, but also a power source, wiring, and other auxiliary devices required for the object 11 to be cooled are disposed around the object 11 to be cooled, so that there is little extra space. For that reason, the locations where the sensor wiring for connection to the temperature sensor 38 and the control device 40 can be installed are limited. However, according to the embodiment, the temperature sensor 38 can be installed at a location different from the object 11 to be cooled, which has a margin in space. The degree of freedom of the installation location is high.

The temperature sensor 38 may be installed in the upstream part 16a of the gas supply line 16. The temperature sensor 38 may be installed downstream of the low-temperature outlet 30b of the heat exchanger 30 in the upstream part 16a of the gas supply line 16. Since the upstream part 16a is on the upstream side with respect to the cryocooler stage 28, the temperature of the cooling gas flowing through the upstream part 16a is higher than the temperature of the cryocooler stage 28. Since the temperature sensor 38 may be selected from those that can measure a relatively high temperature range, a relatively inexpensive sensor can be adopted. In addition to these advantages, it is possible to suppress the influence on the temperature sensor 38 by the strong magnetic field that may be generated in the vicinity of the object 11 to be cooled.

In addition, the temperature sensor 38 may be installed at a measurement location apart from the inlet 18a of the object-to-be-cooled gas flow path 18 along the downstream part 16b of the gas supply line 16. For example, the installation location of the temperature sensor 38 may be determined such that the distance from the outlet 16d of the intermediate part 16c of the gas supply line 16 to the temperature sensor 38 is smaller than the distance from the inlet 18a of the object-to-be-cooled gas flow path 18 to the temperature sensor 38. The temperature sensor 38 may be installed in the intermediate part 16c of the gas supply line 16.

The temperature sensor 38 may be installed at a measurement location away from the outlet 18b of the object-to-be-cooled gas flow path 18 along the gas recovery line 20. The cooling gas flowing through the gas recovery line 20 is heated by the object 11 to be cooled. Therefore, measuring the temperature in the gas recovery line 20 is advantageous in that information about the heat generation amount of the object 11 to be cooled can be acquired more accurately.

The temperature sensor 38 may be installed between the outlet 18b of the object-to-be-cooled gas flow path 18 and the low-temperature inlet 30c of the heat exchanger 30. For example, the installation location of the temperature sensor 38 may be determined such that the distance from the low-temperature inlet 30c to the temperature sensor 38 is smaller than the distance from the outlet 18b of the object-to-be-cooled gas flow path 18 to the temperature sensor 38.

If possible, the temperature sensor 38 may be installed inside the heat exchanger 30.

The temperature sensor 38 is typically disposed in the vacuum chamber 32, but may be installed outside the vacuum chamber 32. For example, the temperature sensor 38 may be installed between the gas circulation source 12 and the high-temperature inlet 30a. Alternatively, the temperature sensor 38 may be installed between the gas circulation source 12 and the high-temperature outlet 30d. In this case, the temperature sensor 38 is advantageous in that an inexpensive general-purpose temperature sensor can be adopted instead of the temperature sensor for measuring the cryogenic temperature.

The temperature sensor 38 may be disposed in the flow path so as to be in contact with the cooling gas, or may be disposed on an outer surface of a pipe without being in physical contact with the cooling gas.

Figure 5A:
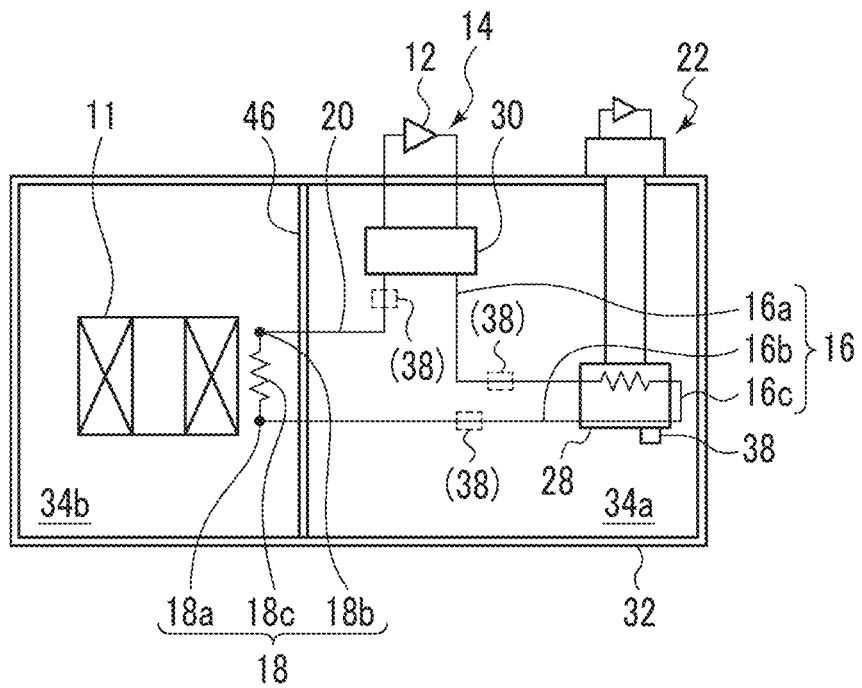
FIGS. 5A and 5B are schematic views illustrating another example of the disposition of the temperature sensor in the cryogenic cooling system according to the embodiment.
Figure 5B:
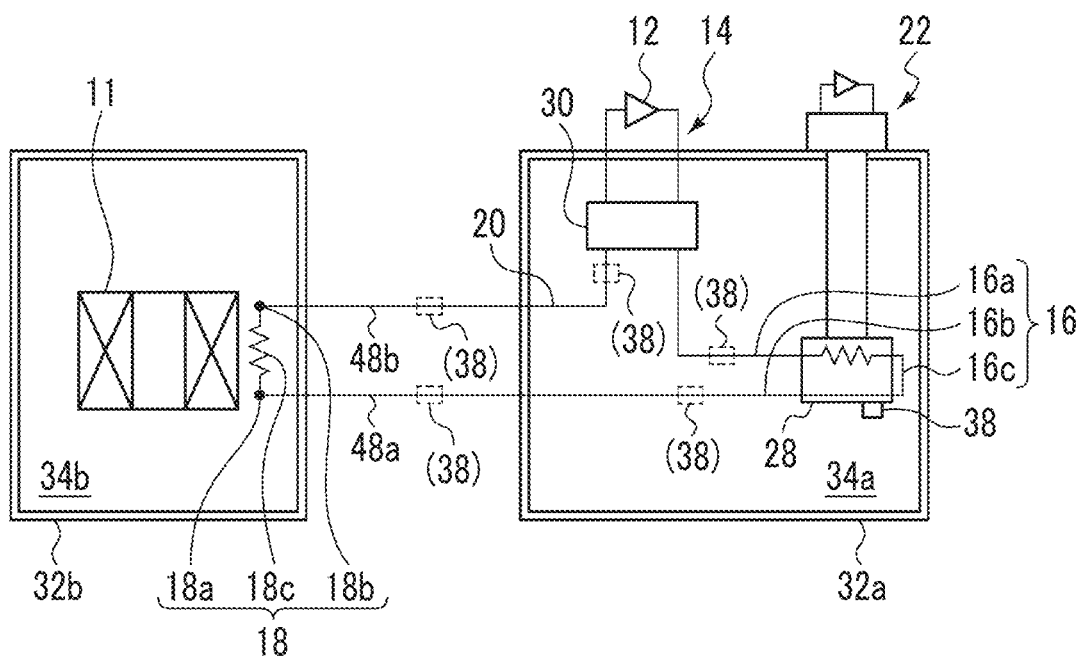

FIGS. 5A and 5B are schematic views illustrating another example of the disposition of the temperature sensor 38 in the cryogenic cooling system 10 according to the embodiment. The other example of the disposition of the temperature sensor 38 will be described with reference to FIGS. 5A and 5B. The cryogenic cooling system 10 illustrated is different from the cryogenic cooling system 10 illustrated in FIG. 1 with respect to the configuration of the vacuum chamber, but the rest is generally common. Hereinafter, different configurations will be mainly described, and common configurations will be briefly described or description thereof will be omitted.

The cryogenic cooling system 10 includes a gas circulation source 12 and a cooling gas flow path 14. The cooling gas flow path 14 includes a gas supply line 16, a object-to-be-cooled gas flow path 18, and a gas recovery line 20. The cryogenic cooling system 10 includes a cryocooler 22 having a cryocooler stage 28, and a heat exchanger 30.

Also in the embodiment illustrated in FIGS. 5A and 5B, the temperature sensor 38 is disposed at a measurement location away from the inlet 18a of the object-to-be-cooled gas flow path 18 along the gas supply line 16, and/or is installed at a measurement location away from the outlet 18b of the object-to-be cooled gas flow path 18 along the gas recovery line 20.

As illustrated in FIG. 5A, the cryogenic cooling system 10 includes a vacuum chamber 32, and the vacuum chamber 32 includes a partition wall 46 that divides the inside thereof into two chambers. The vacuum chamber 32 is divided into a first vacuum environment 34a and a second vacuum environment 34b by the partition wall 46. The cryocooler stage 28 is disposed in the first vacuum environment 34a. The heat exchanger 30 is also disposed in the first vacuum environment 34a. On the other hand, the object-to-be-cooled gas flow path 18 together with the object 11 to be cooled is disposed in the second vacuum environment 34b. The inlet 18a, the outlet 18b, and the gas pipe 18c of the object-to-be-cooled gas flow path 18 are disposed in the second vacuum environment 34b.

The temperature sensor 38 is disposed in the first vacuum environment 34a. The temperature sensor 38 is installed, for example, in the upstream part 16a, the intermediate part 16c, the downstream part 16b of the gas supply line 16, the cryocooler stage 28, and/or the gas recovery line 20. Only one temperature sensor 38 may be provided at any of these installation locations. Alternatively, a plurality of the temperature sensors 38 may be provided.

However, the temperature sensor 38 is not disposed in the second vacuum environment 34b.

As illustrated in FIG. 5B, the cryogenic cooling system 10 includes a first vacuum chamber 32a that defines a first vacuum environment 34a and a second vacuum chamber 32b that defines a second vacuum environment 34b. The cryocooler 22 is installed in the first vacuum chamber 32a, and the cryocooler stage 28 is disposed in the first vacuum chamber 32a, that is, in the first vacuum environment 34a. The heat exchanger 30 is also disposed in the first vacuum environment 34a. On the other hand, the object-to-be-cooled gas flow path 18 together with the object 11 to be cooled is disposed in the second vacuum chamber 32b, that is, in the second vacuum environment 34b. The inlet 18a, the outlet 18b, and the gas pipe 18c of the object-to-be-cooled gas flow path 18 are disposed in the second vacuum environment 34b.

The gas supply line 16 includes a supply-side connecting pipe 48a that connects the gas supply line 16 to the inlet 18a of the object-to-be-cooled gas flow path 18 between the first vacuum chamber 32a and the second vacuum chamber 32b. The gas recovery line 20 includes a recovery-side connecting pipe 48b that connects the gas recovery line 20 to the outlet 18b of the object-to-be-cooled gas flow path 18 between the first vacuum chamber 32a and the second vacuum chamber 32b.

The temperature sensor 38 is disposed in the first vacuum environment 34a. The temperature sensor 38 is installed, for example, in the upstream part 16a, the intermediate part 16c, the downstream part 16b of the gas supply line 16, the cryocooler stage 28, and/or the gas recovery line 20. Only one temperature sensor 38 may be provided at any of these installation locations. Alternatively, a plurality of the temperature sensors 38 may be provided.

The temperature sensor 38 may be installed in the supply-side connecting pipe 48a and/or the recovery-side connecting pipe 48b. In this case, the temperature sensor 38 is disposed outside the first vacuum chamber 32a and the second vacuum chamber 32b.

However, the temperature sensor 38 is not disposed in the second vacuum environment 34b.

By doing so, the temperature sensor 38 can be disposed in a different partition from the object 11 to be cooled. For that reason, even if a strong magnetic field is generated in the vicinity of the object 11 to be cooled, the magnetic field weakens at the installation location of the temperature sensor 38. Therefore, the influence of the strong magnetic field on the temperature sensor 38 can be suppressed.

Figure 6:
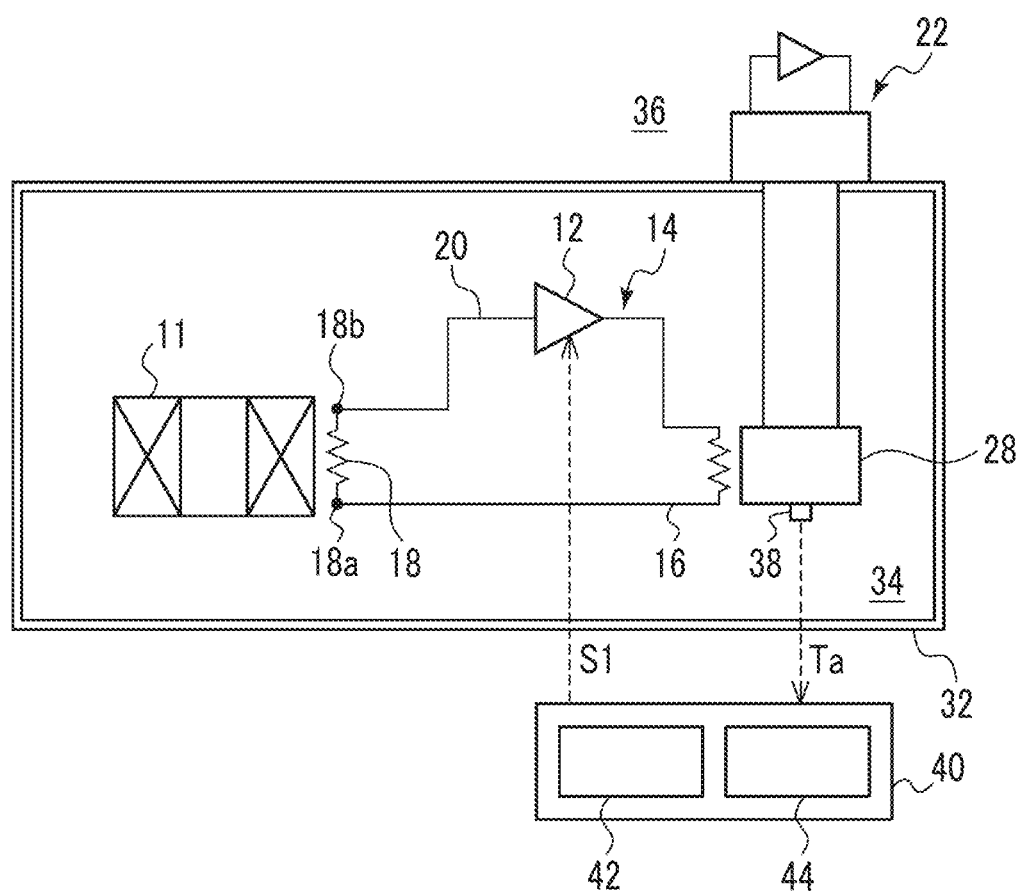
FIG. 6 is a view schematically illustrating another example of the cryogenic cooling system according to the embodiment.

FIG. 6 is a view schematically illustrating another example of the cryogenic cooling system 10 according to the embodiment. The cryogenic cooling system 10 illustrated is different from the cryogenic cooling system 10 illustrated in FIG. 1 with respect to the flow path configuration of the cooling gas, but the rest is generally common. Hereinafter, different configurations will be mainly described, and common configurations will be briefly described or description thereof will be omitted.

The cryogenic cooling system 10 includes a gas circulation source 12 and a cooling gas flow path 14. The cooling gas flow path 14 includes a gas supply line 16, an object-to-be-cooled gas flow path 18, and a gas recovery line 20. The cryogenic cooling system 10 includes a cryocooler 22 having a cryocooler stage 28, and a vacuum chamber 32 that defines a vacuum environment 34.

The gas circulation source 12 is configured to control the supplied cooling gas flow rate according to a gas circulation source control signal S1. The gas circulation source 12 is not limited to the compressor, and may be a blower such as a fan, or other gas flow generation apparatuses. The gas circulation source 12 is configured to generate a flow of gas at a cryogenic temperature (for example, a liquid nitrogen temperature or lower). The gas circulation source 12 is disposed in the vacuum environment 34. Therefore, the entire cooling gas circulation circuit of the cryogenic cooling system 10 is disposed in the vacuum environment 34. In addition, a part of the gas circulation source 12, for example, a drive source such as a motor may be disposed in the surrounding environment 36, and another part of the gas circulation source 12, for example, a rotary blade may be disposed in the vacuum environment 34 and be connected so as to be capable of transmitting power from the drive source to the rotary blade.

Unlike the cryogenic cooling system 10 illustrated in FIG. 1, the heat exchanger is not essential. The cryogenic cooling system 10 illustrated in FIG. 6 is not provided with the heat exchanger for exchanging heat between the gas supply line 16 and the gas recovery line 20. In addition, such a heat exchanger may be provided.

The temperature sensor 38 is configured to generate a measured temperature signal Ta representing a measured temperature at a measurement location and output the measured temperature signal Ta to the control device 40. The temperature sensor 38 is installed in the cryocooler stage 28 as an example. However, as described above, the temperature sensor 38 may be installed at any location of the cooling gas flow path 14. The temperature sensor 38 is provided at a measurement location away from the inlet 18a of the object-to-be-cooled gas flow path 18 along the gas supply line 16 and/or t may be installed at a measurement location away from the outlet 18b of the object-to-be-cooled gas flow path 18 along the gas recovery line 20. Only one temperature sensor 38 or a plurality of the temperature sensors 38 may be provided.

In addition, the cryogenic cooling system 10 also includes a control device 40 including a gas flow rate control unit 42 and a gas flow rate table 44. The gas flow rate control unit 42 generates a gas circulation source control signal S1 according to the gas flow rate table 44 in accordance with the measured temperature signal Ta, and outputs the gas circulation source control signal S1 to the gas circulation source 12.

Also with the cryogenic cooling system 10 illustrated in FIG. 6, the cooling gas flow rate flowing through the object-to-be-cooled gas flow path 18 can be adjusted in accordance with the temperature measured by the temperature sensor 38 to efficiently cool the object 11 to be cooled. In addition, the temperature sensor 38 can be disposed at a location away from the object 11 to be cooled, and it is possible to suppress the influence on the temperature sensor 38 by the strong magnetic field that may be generated in the vicinity of the object 11 to be cooled.

Figure 7:
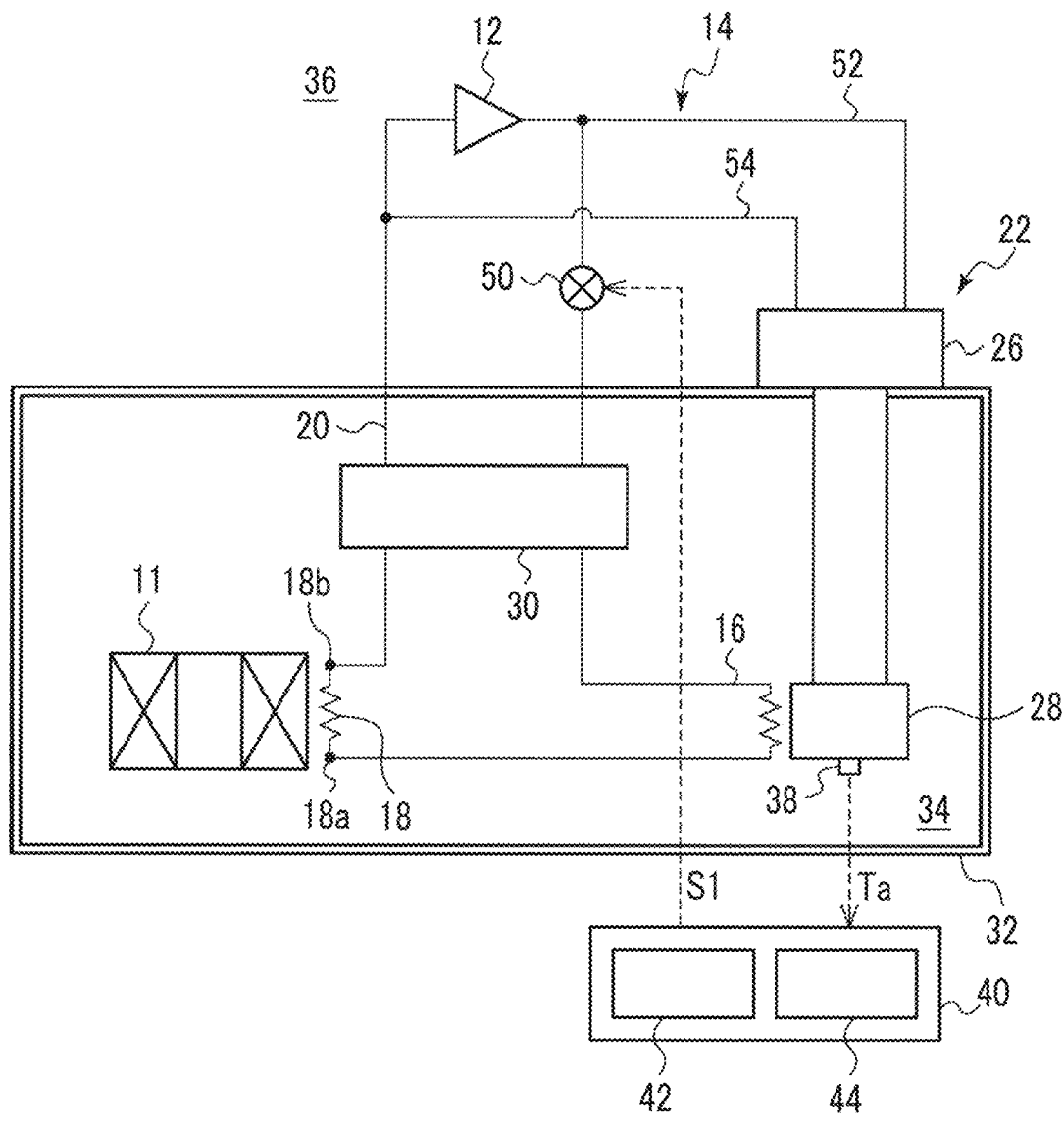
FIG. 7 is a view schematically illustrating another example of the cryogenic cooling system according to the embodiment.

FIG. 7 is a view schematically illustrating another example of the cryogenic cooling system 10 according to the embodiment. The cryogenic cooling system 10 illustrated is different from the cryogenic cooling system 10 illustrated in FIG. 1 with respect to the flow path configuration of the cooling gas, but the rest is generally common. Hereinafter, different configurations will be mainly described, and common configurations will be briefly described or description thereof will be omitted.

The cryogenic cooling system 10 includes a gas circulation source 12 and a cooling gas flow path 14. The cooling gas flow path 14 includes a gas supply line 16, a object-to-be-cooled gas flow path 18, and a gas recovery line 20. The cryogenic cooling system 10 includes a cryocooler 22, a heat exchanger 30, and a vacuum chamber 32 that defines a vacuum environment 34. The cryocooler 22 includes a cold head 26 having a cryocooler stage 28. The gas circulation source 12 is disposed in the surrounding environment 36.

As described above, both the cooling gas and the working gas of the cryocooler 22 may be helium gas. In this way, in a case where the cooling gas and the working gas are the same gas, the cryogenic cooling system 10 may be provided with one common compressor. That is, the gas circulation source 12 not only cause the cooling gas to flow through the cooling gas flow path 14, but also functions as a compressor for circulating the working gas through the cryocooler 22.

In this case, in order to control the flow rate of the cooling gas, the gas circulation source 12 may include a flow rate control valve 50 configured to control the flow rate of the cooling gas flowing through the object-to-be-cooled gas flow path 18. The flow rate control valve 50 is configured to control the cooling gas flow rate to be supplied, according to the gas circulation source control signal S1.

A cryocooler supply line 52 is provided to supply the working gas from the gas circulation source 12 to the cryocooler 22, and a cryocooler recovery line 54 is provided to recover the working gas from the cryocooler 22 to the gas circulation source 12. The cryocooler supply line 52 is branched from the gas supply line 16 in the surrounding environment 36 and connected to the cold head 26, and the cryocooler recovery line 54 is branched from the gas recovery line 20 in the surrounding environment 36 and connected to the cold head 26.

The flow rate control valve 50 is installed in the gas supply line 16 in the surrounding environment 36. Alternatively, the flow rate control valve 50 may be installed in the gas recovery line 20 in the surrounding environment 36. By doing so, a general-purpose flow rate control valve can be adopted as the flow rate control valve 50, which is advantageous in terms of manufacturing cost as compared to a case where the flow rate control valve 50 is installed in the vacuum environment 34. However, the flow rate control valve 50 may be installed in the vacuum environment 34.

The temperature sensor 38 is configured to generate a measured temperature signal Ta representing a measured temperature at a measurement location and output the measured temperature signal Ta to the control device 40. The temperature sensor 38 is installed in the cryocooler stage 28 as an example. However, as described above, the temperature sensor 38 may be installed at any location of the cooling gas flow path 14. The temperature sensor 38 is provided at a measurement location away from the inlet 18a of the object-to-be-cooled gas flow path 18 along the gas supply line 16 and/or t may be installed at a measurement location away from the outlet 18b of the object-to-be-cooled gas flow path 18 along the gas recovery line 20. Only one temperature sensor 38 or a plurality of the temperature sensors 38 may be provided.

In addition, the cryogenic cooling system 10 also includes a control device 40 including a gas flow rate control unit 42 and a gas flow rate table 44. The gas flow rate control unit 42 generates a gas circulation source control signal S1 according to the gas flow rate table 44 in accordance with the measured temperature signal Ta, and outputs the gas circulation source control signal S1 to the gas circulation source 12, that is, the flow rate control valve 50.

Also with the cryogenic cooling system 10 illustrated in FIG. 7, the flow rate of the cooling gas flowing through the object-to-be-cooled gas flow path 18 can be adjusted in accordance with the temperature measured by the temperature sensor 38, and the object 11 to be cooled can be cooled efficiently. In addition, the temperature sensor 38 can be disposed at a location away from the object 11 to be cooled, and it is possible to suppress the influence on the temperature sensor 38 by the strong magnetic field that may be generated in the vicinity of the object 11 to be cooled.

In addition, in the embodiment illustrated in FIGS. 6 and 7, as illustrated in FIG. 5A, the vacuum chamber 32 may be provided with the partition wall 46, and may be partitioned into the first vacuum environment 34a and the second vacuum environment 34b. In addition, as illustrated in FIG. 5B, the cryogenic cooling system 10 may include the first vacuum chamber 32a that defines the first vacuum environment 34a and the second vacuum chamber 32b that defines the second vacuum environment 34b. The temperature sensor 38 may be disposed in the first vacuum environment 34a.

The present invention has been described above on the basis of the embodiments. It is understood by those skilled in the art that the present invention is not limited to the above-described embodiment, various design changes can be made, various modifications can be made, and such modifications are also within the scope of the present invention.

Various features described in connection with one embodiment may also be applicable to other embodiments. The new embodiments that result from the combination also have the effects of each of the combined embodiments.

The present invention can be utilized in the field of cryogenic cooling systems.

It should be understood that the invention is not limited to the above-described embodiment, but may be modified into various forms on the basis of the spirit of the invention. Additionally, the modifications are included in the scope of the invention.

What is claimed is:

1. A cryogenic cooling system comprising:
   a gas circulation source that circulates a cooling gas;
   a cryocooler including a cryocooler stage that cools the cooling gas;
   an object-to-be-cooled gas flow path provided around or inside an object to be cooled for causing the cooling gas to flow therethrough;
   a gas supply line that connects the gas circulation source to an inlet of the object-to-be-cooled gas flow path to supply the cooling gas from the gas circulation source via the cryocooler stage to the object-to-be-cooled gas flow path;
   a gas recovery line that connects an outlet of the object-to-be-cooled gas flow path to the gas circulation source so as to recover the cooling gas from the object-to-be-cooled gas flow path to the gas circulation source;
   at least one temperature sensor that is installed at a measurement location away from the inlet of the object-to-be-cooled gas flow path along the gas supply line and/or a measurement location installed away from the outlet of the object-to-be-cooled gas flow path along the gas recovery line; and
   a gas flow rate control unit that controls the gas circulation source so as to adjust a flow rate of the cooling gas flowing through the object-to-be-cooled gas flow path in accordance with a measured temperature at at least one measurement location by the temperature sensor,
   wherein the gas flow rate control unit includes a gas flow rate table configured to associate a target cooling gas flow rate with each of a plurality of different cooling temperatures at a specific measurement location, and
   wherein the gas flow rate control unit determines the target cooling gas flow rate in accordance with a measured temperature at the specific measurement location according to the gas flow rate table, and controls the gas circulation source so as to cause the cooling gas to flow through the object-to-be-cooled gas flow path with the target cooling gas flow rate.

2. The cryogenic cooling system according to claim 1, wherein the gas supply line includes an upstream part from the gas circulation source to the cryocooler stage and a downstream part from the cryocooler stage to the inlet of the object-to-be-cooled gas flow path, and wherein the temperature sensor is installed in the upstream part of the gas supply line or in the cryocooler stage.

3. The cryogenic cooling system according to claim 1, wherein the cryocooler stage is disposed in a first vacuum environment, wherein the object-to-be-cooled gas flow path is disposed in a second vacuum environment isolated from the first vacuum environment, and wherein the temperature sensor is disposed in the first vacuum environment.

4. The cryogenic cooling system according to claim 1, wherein only one temperature sensor is provided, and the temperature sensor is installed at any of a measurement location away from the inlet of the object-to-be-cooled gas flow path along the gas supply line or at a measurement location away from the outlet of the object-to-be-cooled gas flow path along the gas recovery line.

5. The cryogenic cooling system according to claim 1, wherein the gas flow rate table is configured to associate an optimal cooling gas flow rate for maximizing a cooling capacity of the cryogenic cooling system with each of a plurality of different cooling temperatures at the specific measurement location.

6. The cryogenic cooling system according to claim 1, wherein the object to be cooled is a superconducting electromagnet.

7. The cryogenic cooling system according to claim 1, further comprising:

a motor which drives the gas circulation source, wherein the gas flow rate control unit is configured to control a rotation speed of the motor.

8. The cryogenic cooling system according to claim 1, wherein the gas circulation source includes a flow rate control valve which is configured to control a flow rate of the cooling gas flowing through the object-to-be-cooled gas flow path, wherein the flow rate control valve is disposed in a surrounding environment, and wherein the gas flow rate control unit is configured to control the flow rate control valve.

\* \* \* \* \*